United States Patent [19]
Lombreschi et al.

[11] Patent Number: 5,818,274
[45] Date of Patent: Oct. 6, 1998

[54] FLIP-FLOP CIRCUIT

[75] Inventors: Giampaolo Lombreschi, Turin; Maurizio Gallinari, Pavia; Marco Morelli, Milan, all of Italy

[73] Assignees: SGS-Thomson Microelectronics S.r.l., Agrate Brianza; Magneti Marelli S.p.A., Milan, both of Italy

[21] Appl. No.: 740,345

[22] Filed: Nov. 7, 1996

[30] Foreign Application Priority Data

Nov. 7, 1995 [EP] European Pat. Off. ............. 95830472

[51] Int. Cl.⁶ .................................................. H03K 3/037
[52] U.S. Cl. ........................ 327/217; 327/218; 327/225
[58] Field of Search .................................. 327/141, 142, 327/143, 199–203, 208–212, 213, 217, 218, 225, 165, 166, 172–176, 34

[56] References Cited

U.S. PATENT DOCUMENTS

| | | | |
|---|---|---|---|
| 4,525,635 | 6/1985 | Gillberg | 327/217 |
| 5,323,065 | 6/1994 | Ebihara et al. | 327/202 |
| 5,327,019 | 7/1994 | Kluck | 307/272.1 |
| 5,331,669 | 7/1994 | Wang et al. | 327/141 |
| 5,373,200 | 12/1994 | Hasegawa et al. | 327/218 |

FOREIGN PATENT DOCUMENTS

| | | | |
|---|---|---|---|
| 0044397 | 1/1982 | European Pat. Off. | |
| 0406786 | 1/1991 | European Pat. Off. | |
| 4132325 | 4/1993 | Germany | |
| 55-79527 | 6/1980 | Japan | 327/172 |
| 62-26041 | 11/1987 | Japan | 327/202 |
| 4-186914 | 7/1992 | Japan | 327/166 |
| 6-177715 | 6/1994 | Japan | 327/217 |

OTHER PUBLICATIONS

"High performance edge triggered D latch designed directly from circuit components rather than using several levels of logic gates," IBM Technical Disclosure Bulletin, vol. 35, No. 5, 1 Oct. 1992, New York, U.S., pp. 192–195, XP 000312931.

Computer Engineering Hardware Design, Morris Mano, by Prentice Hall, N.J 07632, pp. 124–125, 1988.

"Computer Engineering Hardware Design" by Mano, pp. 122–123, 1988.

*Primary Examiner*—Timothy P. Callahan
*Assistant Examiner*—T. T. Lam
*Attorney, Agent, or Firm*—Allen, Dyer, Doppelt, Milbrath & Gilchrist, P.A.

[57] ABSTRACT

A flip-flop circuit able to commute in correspondence with any logic transition of the input signal using a flip-flop and a logic gate of the EXNOR type receiving at its input a signal and the inverted output of the flip-flop. To the output of the EXNOR gate is connected a set-reset flip-flop which allows a reset to be effected after each commutation of the circuit in order to prepare it for the next transition.

27 Claims, 10 Drawing Sheets

FLIP-FLOP CIRCUIT

CROSS REFERENCE TO RELATED APPLICATIONS

This application claims priority from EP 95830472.7, filed Nov. 7, 1995.

BACKGROUND AND SUMMARY OF THE INVENTION

The present invention relates generally to a logic circuit of the flip-flop type. More specifically, the present invention relates to a circuit configuration for a flip-flop which commutes in correspondence with any logic transition of the input, the application of which requires a reset after each commutation in order to prearrange it for the next transition.

The present invention can advantageously be applied to monolithic integrated circuits in which there is the problem of providing a pulse after any logic transition (from 0 to 1 and from 1 to 0) of one or several signals in which the application requires a reset after each commutation, utilizing the minimum area on the integrated circuit.

Standard circuits which perform this type of function are not known in the art, and therefore, to obtain the desired result, use is typically made of two D type FFD flip-flops with reset (FIG. 1) in which each D type FFD flip-flop is made with 24 transistors. The logic diagram of this arrangement is shown in FIG. 1, while the diagram of an FFD flip-flop is shown in FIG. 2.

As will be seen, the input signal IN, the transitions of which it is desired to detect, is applied to the clock inputs CP of both D type FFD flip-flops. The input signal IN is applied to one of the FFD flip-flops inverted by means of a logic NOT gate INV. The data inputs D of both FFD flip-flops are connected to a high logic value (supply voltage V+). The outputs Q of the FFD flip-flops are connected together in OR configuration by means of a logic gate O to provide the output OUT of the circuit. The circuit is further provided with a reset input RST which is connected in parallel to both the reset inputs CD of the FFD flip-flops in such a way as to allow the outputs Q, and therefore the output OUT of the circuit, to be reset after detection of a transition in the input signal IN.

The D type FFD flip-flops (with reference to FIG. 2) are sensitive to the rising edge of an input signal at the terminal CP so that, by utilizing the signal IN, the commutation of which it is desired to detect as the clock signal on the terminal CP of the first FFD flip-flop and the same signal IN inverted for the second FFD flip-flop, it is possible to detect each logic transition thereof through the OR connection of the outputs A and B of the two FFD flip-flops.

In particular, if the number of commuting signals is equal to n and it is necessary to generate a pulse which detects the commutation of any signal, it is necessary to multiply the number of FFD flip-flops used by 2 n. This is seen in FIG. 3. As will be noted, if it is desired to detect the transitions of n input signals IN1, IN2 . . . INn, 2 n FFD flip-flops are needed.

The conventional circuit which performs the said function in the case of a single signal (FIG. 1) is constituted by 54 transistors. The waveforms of the various signals are plotted in FIG. 4, while the truth table is as follows:

| RST | IN   | OUT |
|-----|------|-----|
| L   | X    | L   |
| H   | L->H | H   |
| H   | H->L | H   | where, naturally, L stands for low logic level or 0, H stands for high logic level or 1, and X stands for indifferent.

The output OUT, which is at high logic level after the said transitions of the input signal IN, must be returned to the low logic level via an externally provided reset signal RST, provided for the purpose of setting it ready for the next commutation, which otherwise would be ignored since the output OUT would not change its state.

The prior art arrangements, therefore, while solving the problem of performing the described functions, have technical disadvantages. These arrangements in fact require the use of a large number of transistors and consequently require a large surface area of an integrated circuit thereby reducing its degree of integration and increasing its cost.

The object of the present invention is that of providing a flip-flop circuit which allows all the above-indicated problems to be solved in a satisfactory manner.

According to the present invention this object is achieved by a flip-flop circuit having the characteristics indicated in the claims which follow the present description.

BRIEF DESCRIPTION OF THE DRAWING

Further advantages and characteristics of the present invention will become apparent from the following detailed description, given with the aid of the attached drawings, provided by way of non-limitative example, in which.

DETAILED DESCRIPTION

Figure 5:
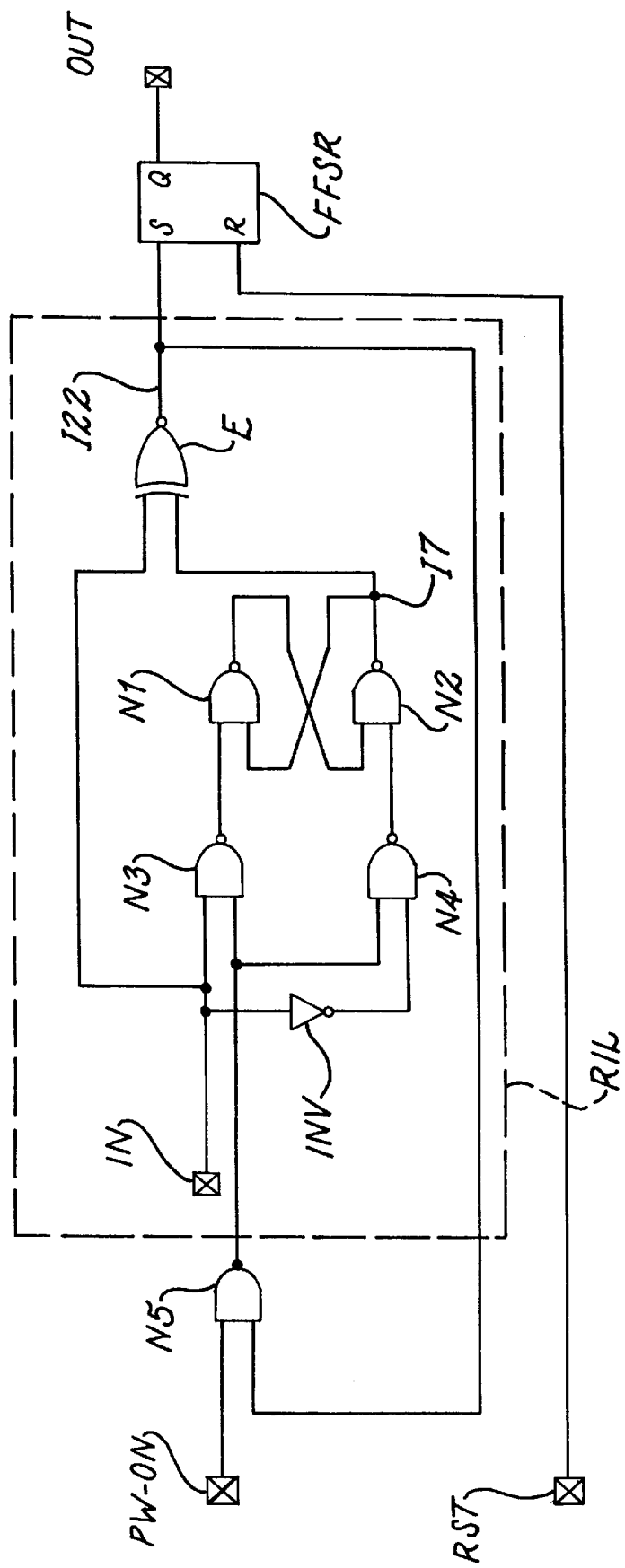
FIG. 5 is a circuit diagram of a possible embodiment of the device according to the present invention.

A possible embodiment of the flip-flop circuit according to the present invention is shown for example in FIG. 5. As can be seen, this circuit is relatively simple in that it is constituted by five logic NAND gates N1, N2, N3, N4, N5, an EXNOR (exclusive NOR) logic gate E, a logic NOT gate INV and a flip-flop FFRS of the set-reset type.

As can be seen the four NAND gates N1, N2, N3, N4 and the NOT gate INV form a flip-flop. This flip-flop N1, N2, N3, N4, INV receives at its data input the signal IN the transitions of which it is desired to detect. This signal IN, moreover, is applied to the input of the EXNOR gate E. The output of the EXNOR gate E is connected to the set input of the set-reset flip-flop FFRS in such a way as to allow the output OUT of the circuit to be set subsequent to detection of a transition in the signal IN. The second input of the EXNOR gate E is connected to the inverted output, indicated I7, of the flip-flop N1, N2, N3, N4, INV in such a way as to allow detection of the other type of transition of the signal IN. The reset input of the flip-flop FFSR is connected to a reset input RST of the circuit in such a way as to allow reset of the output OUT of the circuit subsequent to detection of a transition of the signal IN. Moreover, the output, indicated I22, of the EXNOR gate E is connected to one input of a further NAND gate N5 the output of which is connected to the enable input of the flip-flop N1, N2, N3, N4, INV. The other input of the further NAND gate N5 is connected to one input PW-ON to which is applied a signal indicative of the presence of power supply to the circuit.

The principle of operation is as follows. At a first initialization (or reset) (signal RST=1 and signal PW-ON=0), the output OUT of the FFRS flip-flop is at logic level 0, while the node I7 (the inverted output of the flip-flop N1, N2, N3, N4, INV) is at the complementary logic level with respect to the input signal IN the commutation of which it is desired to detect (I7=1 if IN=0, I7=0 if IN=1). Moreover, the node I22 (output of the gate E) is at logic level 0.

At power-up of the circuit, which corresponds to a reset, the signal PW-ON goes stably to logic level 1. When the input RST goes to 0, at the first logic commutation of the signal IN, the EXNOR logic gate E has at its inputs two signals having the same logic level, therefore the node I22 changes from logic level 0 to logic level 1 taking to 1 the output OUT of the flip-flop FFRS which is constituted by two logic NOR gates (not illustrated).

At this point the signal on the node I22, with a certain delay given by the logic gates, carries the node I7 to the complementary logic level with respect to the signal IN, preparing the circuit to receive the next commutation of the signal IN. The node I22 therefore provides a pulse, the duration of which is given by the delay time of the logic gates, as a consequence of any change in level of the input signal IN.

In order to obtain an output signal of the desired duration in correspondence with each commutation, the flip-flop FFRS is acted on by the signal RST. When this signal RST passes from logic level 0 to logic level 1 the signal on the output OUT, taken to logic level 1 by commutation of the signal IN, returns to logic level 0. Subsequently the flip-flop FFRS is ready to receive a new transition of the input IN.

Figure 6:
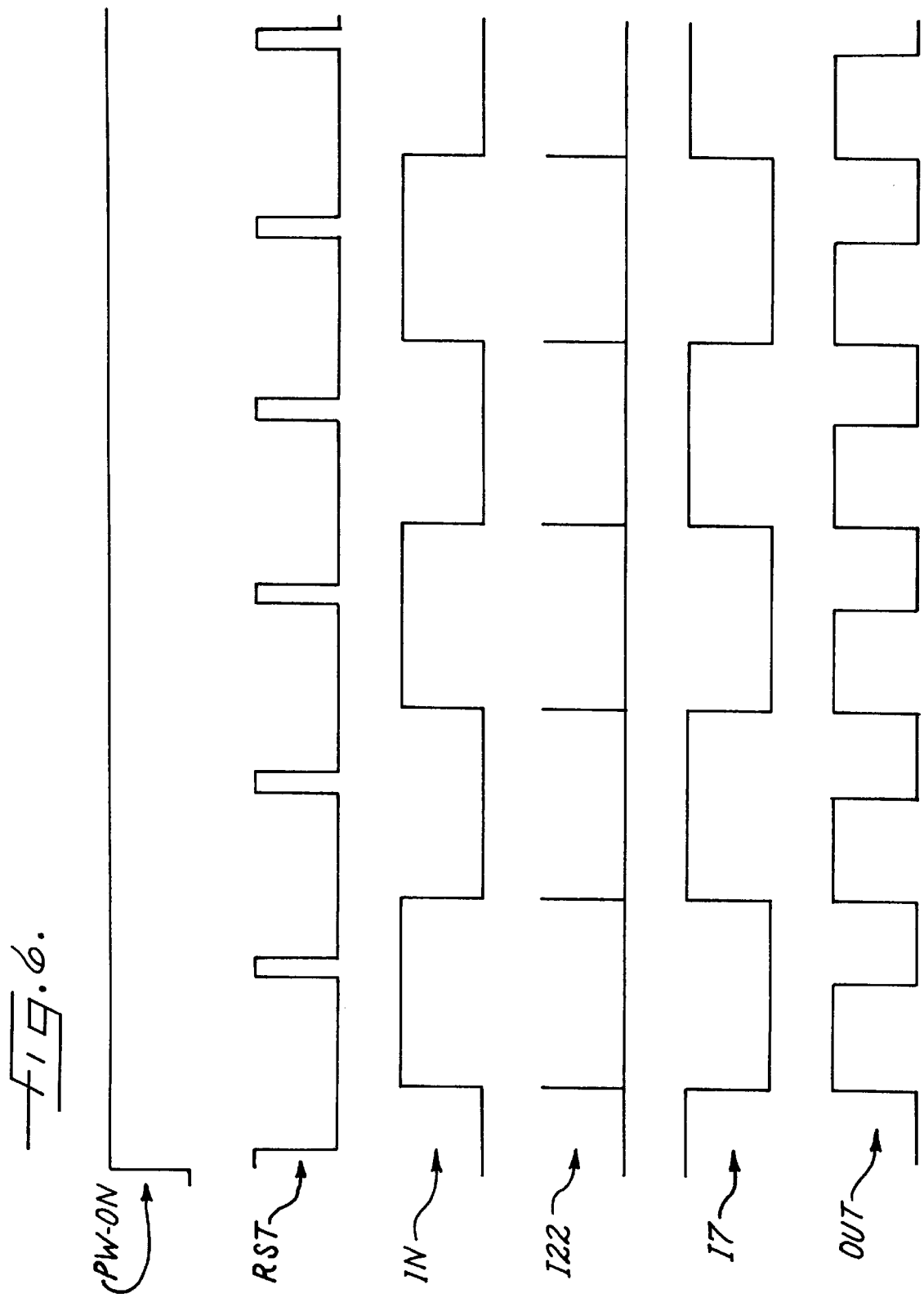
FIG. 6 is a set of cartesian time diagrams illustrating the operation of the device according to the invention.

The waveforms of the various signals which are obtained are plotted in FIG. 6. The circuit in this embodiment just described is constituted by 40 transistors.

From the point of view of the area of the integrated circuit utilized, the invention is more advantageous the greater the number of signals in correspondence with the commutations of which it is necessary to generate a pulse. In fact, it is not necessary to duplicate the entire circuit, but only the portion, indicated RIL, contained in the broken outline square of FIG. 5. See FIG. 7, for an example of an embodiment having two input signals IN1 and IN2.

In the case of two signals IN1 and IN2, which can commute together or separately, the outputs of the EXNOR gates are connected together in OR configuration such that any commutation of one input, or both, generates a pulse which takes to 1 the output of the flip-flop FFRS, and therefore the output OUT of the circuit. Therefore it is not necessary to duplicate the entire structure in the case of two inputs as, on the other hand, was required by the previously described prior art arrangement.

Figure 7:
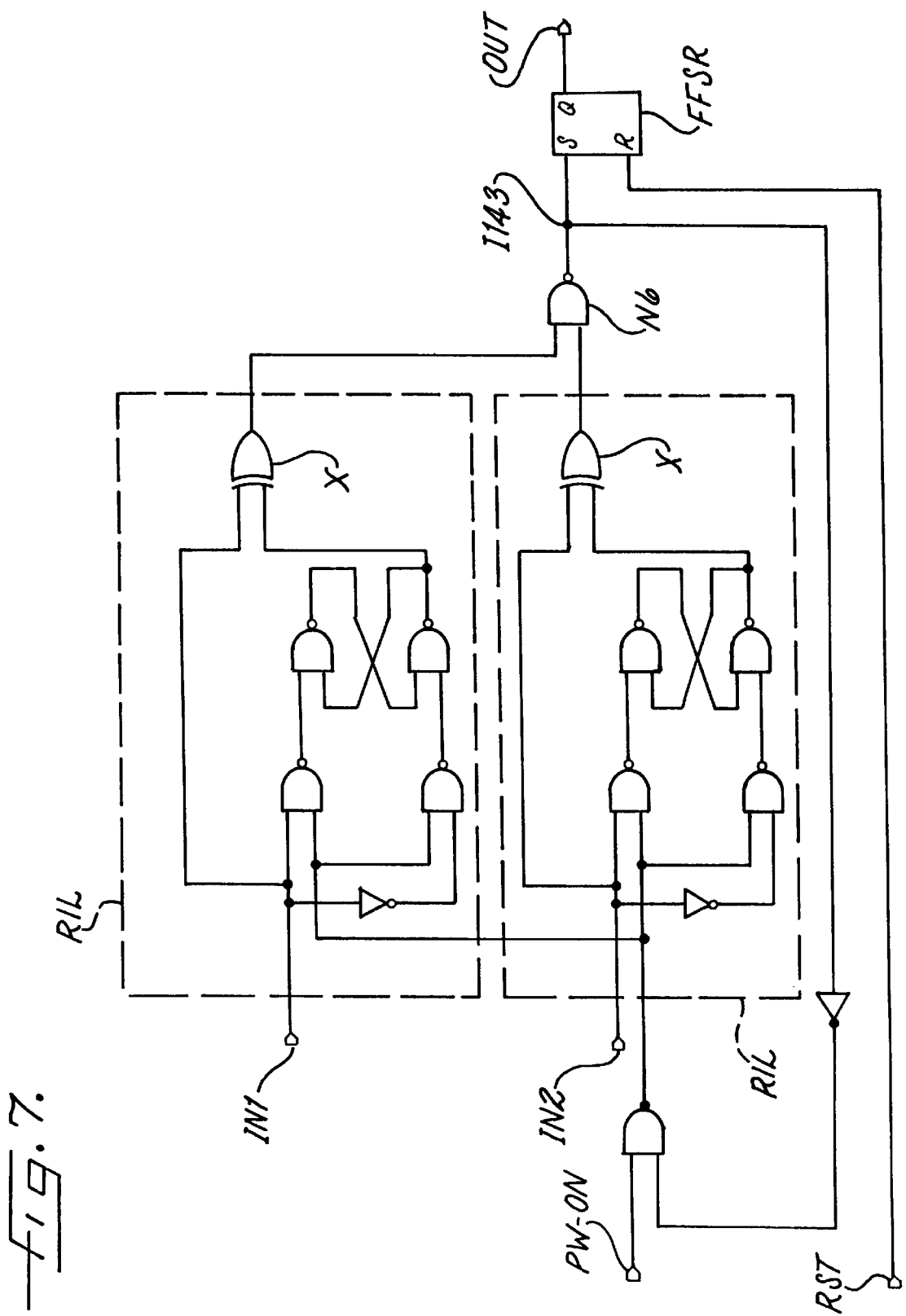
FIG. 7, like FIG. 5, shows an embodiment of the device according to the invention having two inputs.
Figure 8:
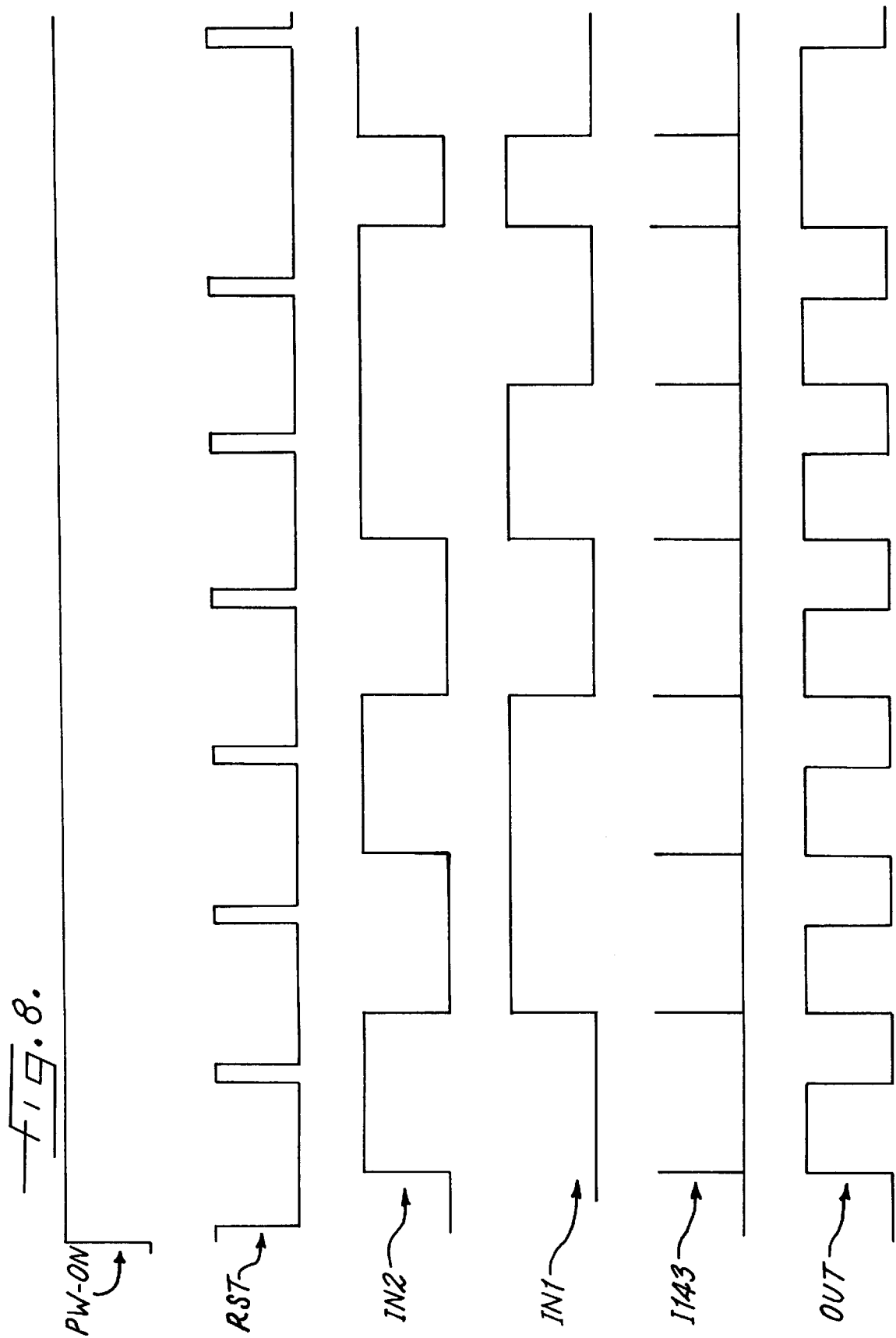
FIG. 8, like FIG. 6, shows a set of cartesian timing diagrams illustrating the operation of the circuit of FIG. 7.

The waveforms relating to the circuit of FIG. 7 are shown in FIG. 8. From this figure it will also be seen that the voltage on the node I143 (which takes the output of the flip-flop FFRS to 1) is a pulse which is activated at each commutation of one or both inputs IN1 and IN2, whilst the output OUT is conditioned by the signal RST.

With reference to FIG. 7, if the De Morgan laws are applied it is possible to optimize the number of logic gates by substituting the OR gate with a NAND gate N6 and the EXNOR gates with EXOR gates X as in effect illustrated.

Figure 9:
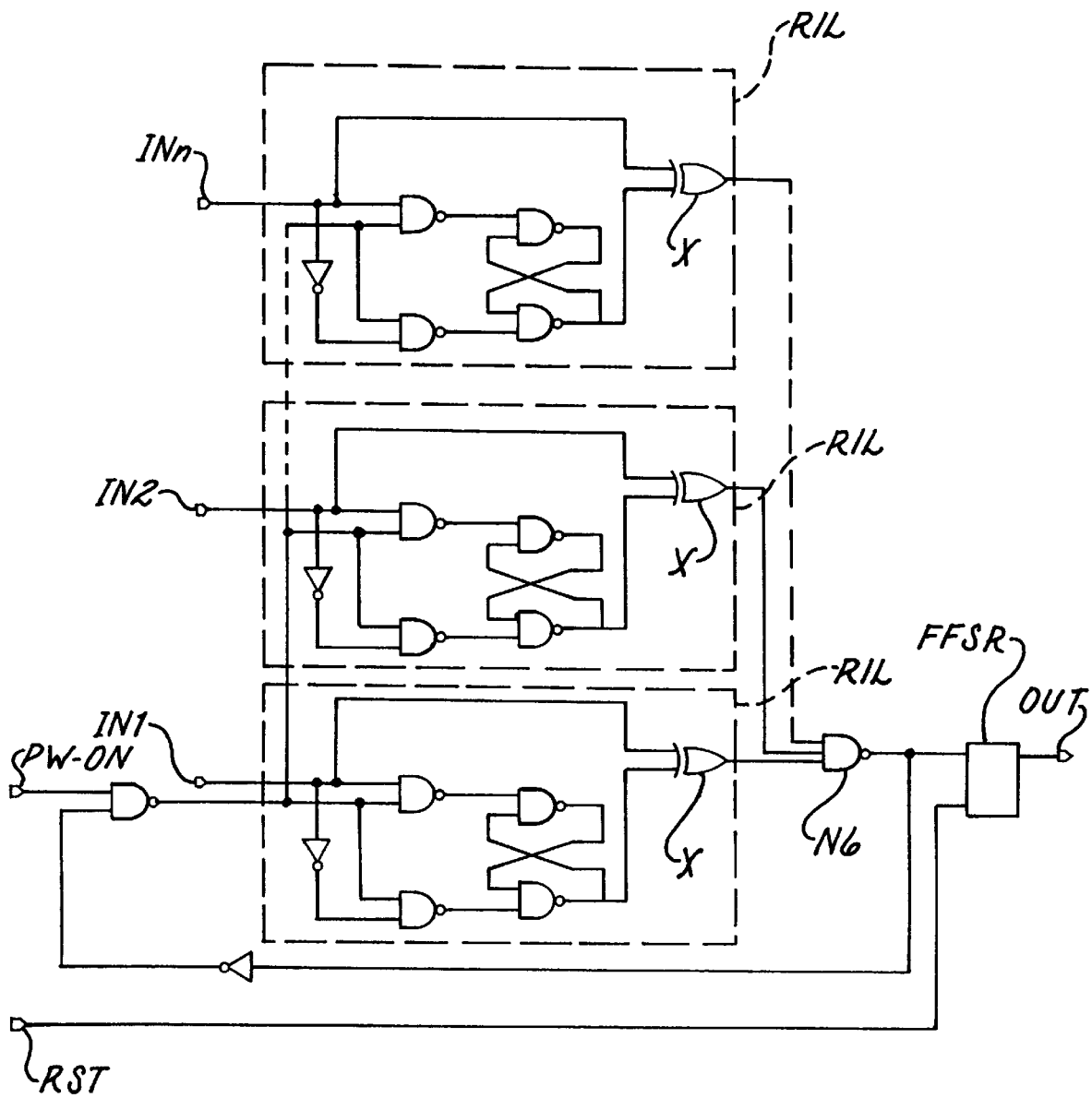
FIG. 9 is a schematic representation of an embodiment of the device according to the invention having n inputs.

In FIG. 9 is shown an embodiment of the circuit according to the invention, similar to the circuit of FIG. 7, generalized to the case in which there are input signals IN1, IN2, . .. , INn, the transitions of which it is desired to detect.

Figure 10:
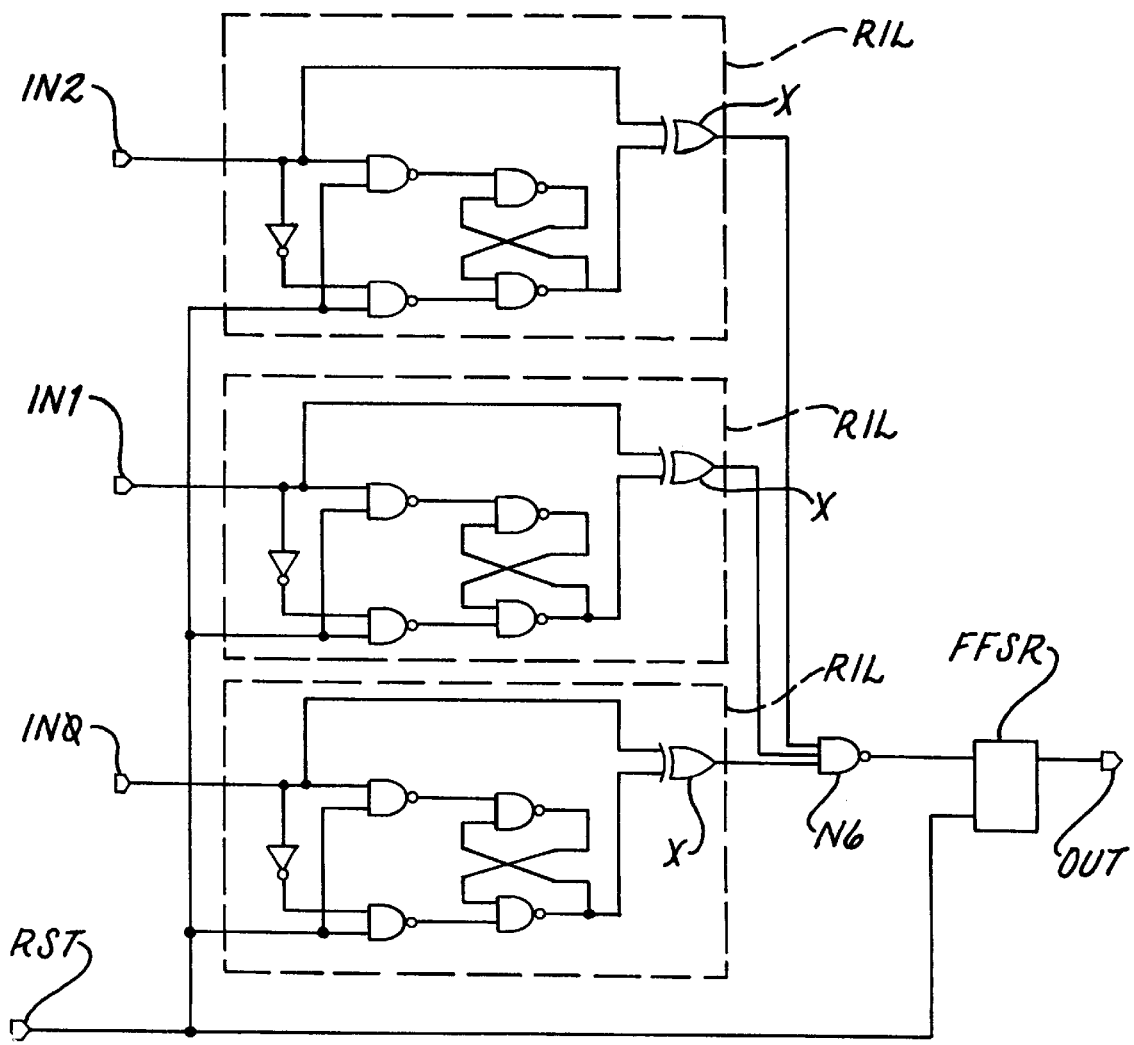
FIG. 10 is a schematic representation of a further alternative embodiment of the device according to the invention having three inputs.

In FIG. 10 is shown one alternative embodiment of the circuit IN0, IN1 and IN2 according to the invention having three inputs. In this diagram it can be seen how the signal RST is utilized both to take the output OUT of the circuit to 0 and to reset the state of the three flip-flops N1, N2, N3, N4, INV after a commutation.

The truth table of the circuit shown in FIG. 5 for a single input signal IN is as follows:

| RST | IN   | OUT |
|-----|------|-----|
| L   | X    | L   |
| H   | L->H | H   |
| H   | H->L | H   |

The advantages of the circuit according to the present invention are given by the possibility of using a circuit which performs the functions of a pair of reset flip-flops having a minimum area.

Figure 1:
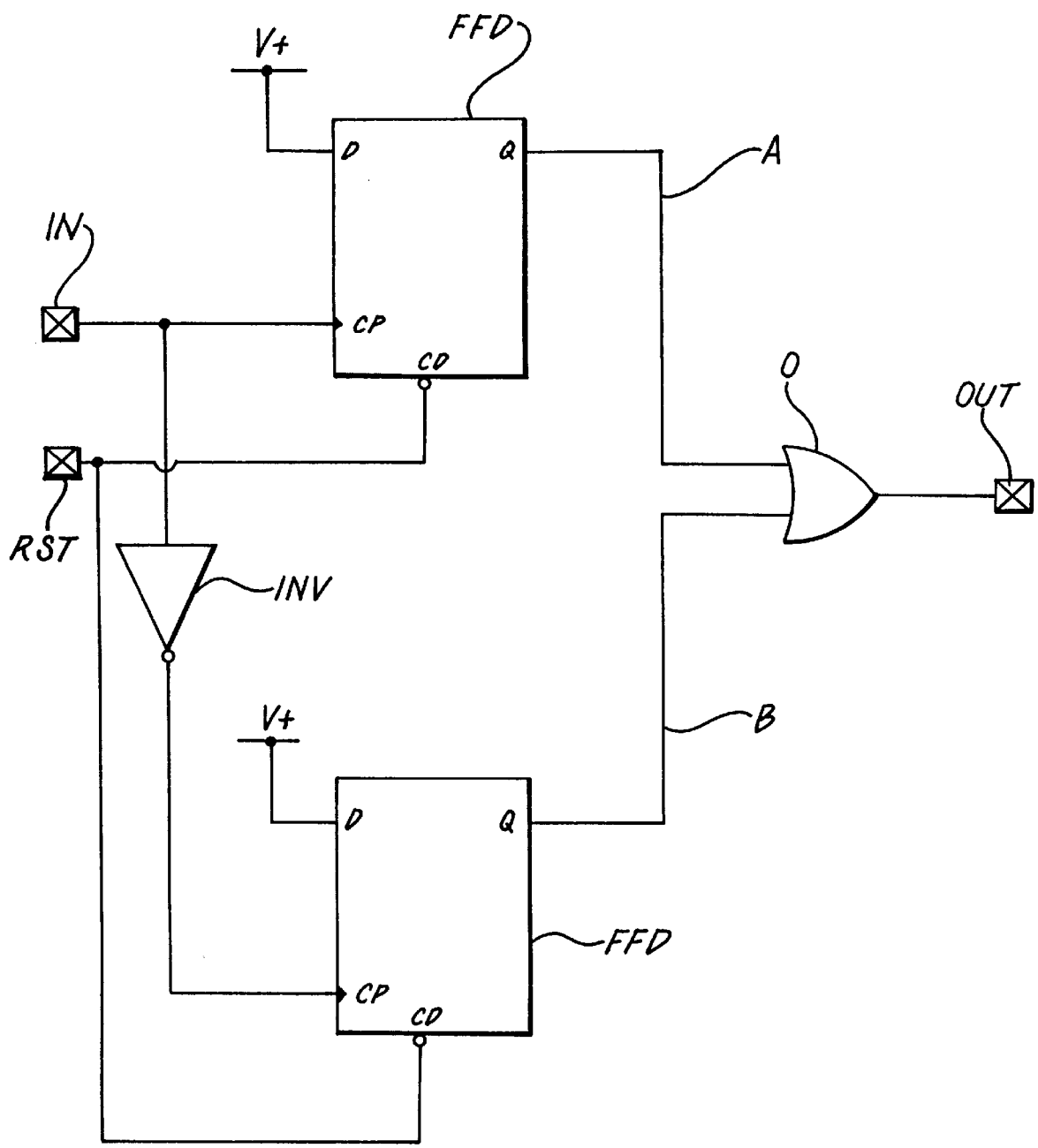
FIGS. 1, 2, 3 and 4 relate to the prior art and have already been described.
Figure 2:
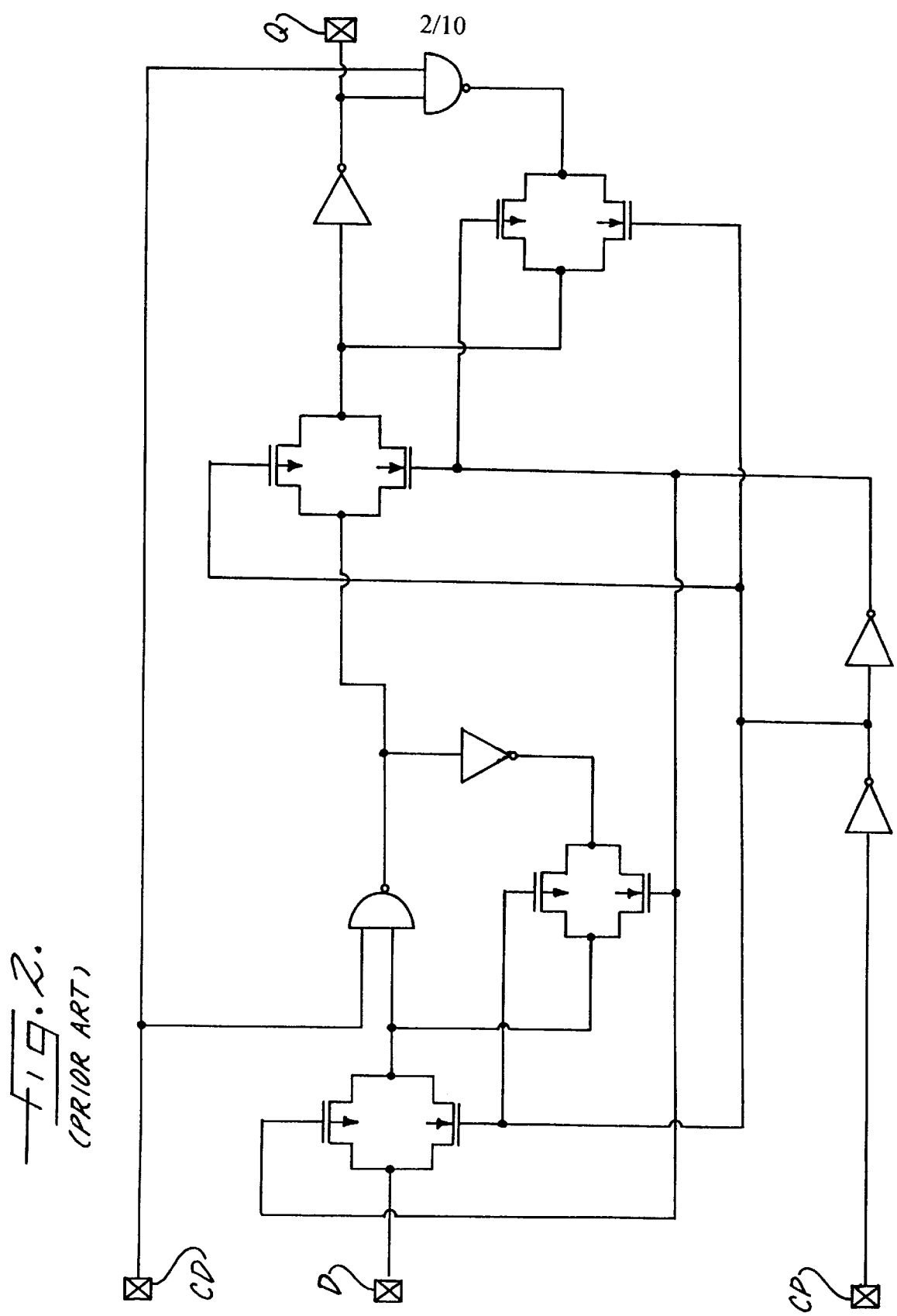
Figure 3:
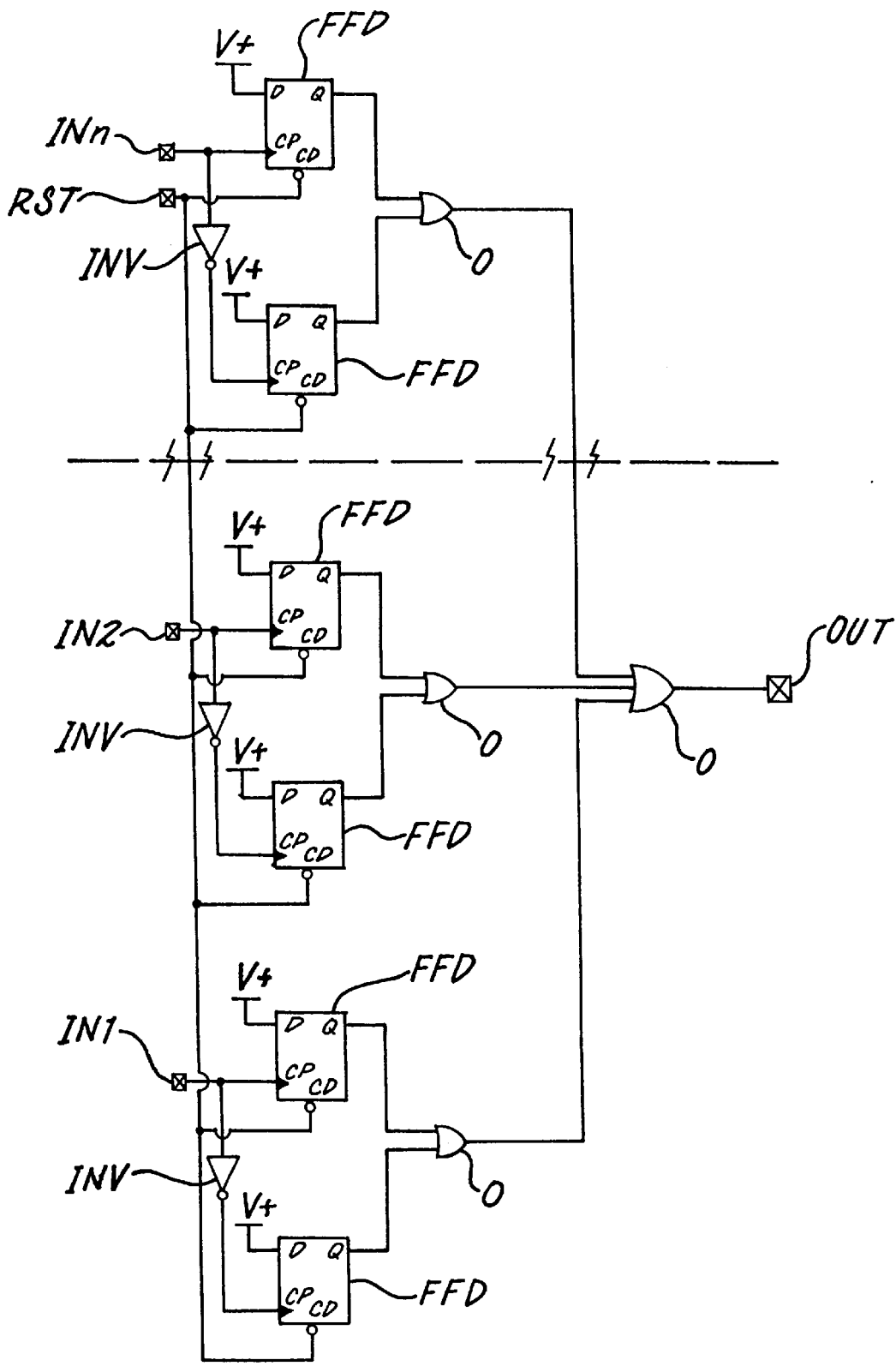
Figure 4:
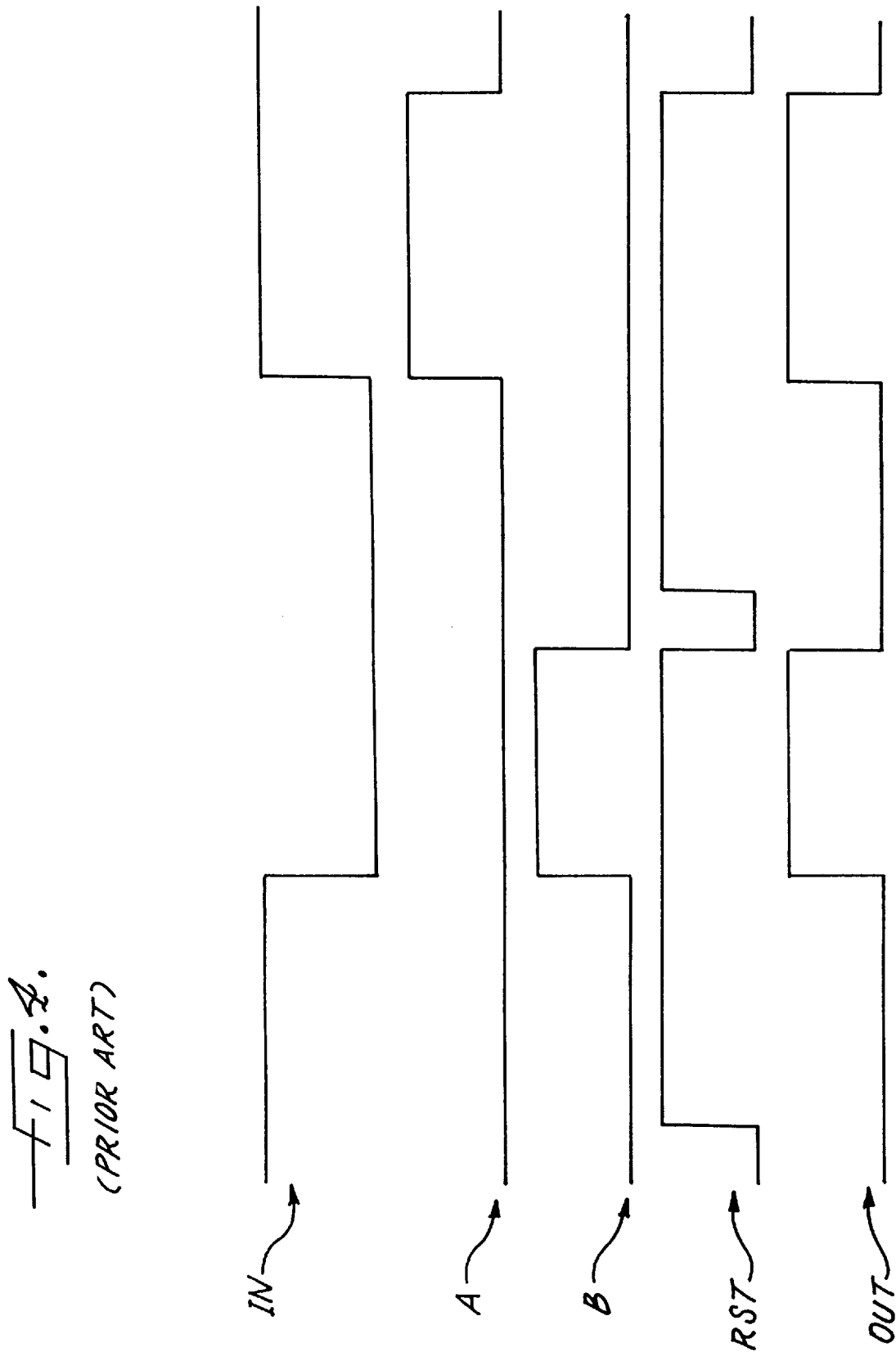

As can be seen from the diagrams of FIGS. 3 and 9, the advantage is greater the higher the number of signals the commutation of which it is desired to detect. The following table shows the comparison, in terms of transistors utilized, between the arrangement according to the prior art and the solution of the present invention for 1, 2 and 3 inputs.

|          | PRIOR ART NO. OF TRANSISTORS | INVENTION NO. OF TRANSISTORS |
|----------|------------------------------|------------------------------|
| 1 Input  | 56                           | 36                           |
| 3 Inputs | 174                          | 98                           |
| 5 Inputs | 290                          | 158                          |

Naturally, the principle of the invention remaining the same, the details of construction and the embodiments can be widely varied with respect to what has been described and illustrated, such as for example in the case of the circuit diagram illustrated in FIG. 10 where the input signal RST is utilized both to take the output to 0 and to "update" the flip-flop N1, N2, N3, N4, INV after a commutation of the inputs, without by this departing from the scope of the present invention.

What is claimed is:

1. A logic circuit of the flip-flop type operable to commute an output signal in correspondence with any logic transition of an input signal comprising:
   a flip-flop having a data input receiving said input signal,
   a combinatory circuit performing an XOR logic function followed by an inverting logic function and having a first input receiving said input signal and a second input connected to the inverting output of said flip-flop, and
   a flip-flop of the set-reset type having a set input connected to the output of said combinatory circuit, and a reset input connected to receive a reset signal.

2. A logic circuit according to claim 1, wherein said combinatory circuit includes an XNOR logic gate.

3. A logic circuit according to claim 1, further comprising a feedback circuit connecting the output of said combinatory circuit to an enable input of said flip-flop for the purpose of preparing said flip-flop, after a transition, for a new transition of said input signal.

4. A logic circuit according to claim 3, wherein said feedback circuit includes a logic gate performing an inverting logic function having an input connected to the output of said combinatory circuit and its output connected to said enable input of said flip-flop.

5. A logic circuit according to claim 4, wherein said logic gate is of the NAND type and has a first input connected to the output of said combinatory circuit and a second input receiving a signal indicative of the supply of power to said logic circuit for initializing said logic circuit when it is turned on.

6. A logic circuit according to claim 1, wherein said flip-flop generates a signal constituting the input of a D-type flip-flop.

7. A logic circuit, operable to commute an output signal in correspondence with any logic transition of a plurality of input signals, comprising:

a plurality of D-type flips-flops each receiving at an input thereof one of said plurality of input signals, a combinatory circuit performing an XOR logic function followed by an inverting logic function, having a plurality of pairs of inputs, each of said pairs having:
a first input receiving one of said plurality of input signals,
a second input connected to the inverted output of the corresponding D-type flip-flop,
an output connected to the set input of another set-reset flip-flop.

8. A logic circuit according to claim 7, wherein said combinatory circuit includes a plurality of XNOR logic gates each having:

the first input receiving one of said input plurality of signals, the second input connected to the inverted output of said corresponding set-reset flip-flop, and a logic gate receiving at inputs thereof the outputs of said plurality of XNOR logic gates and having an output connected to said set input of said another set-reset flip-flop.

9. A logic circuit according to claim 7, wherein the said combinatory circuit includes a plurality of XOR logic gates each having:

the first input receiving one of said plurality of input signals, the second input connected to the inverted output of said corresponding set-reset flip-flop, and a logic gate of the NAND type receiving at inputs thereof the outputs of said plurality of XOR gates (X) and having an output connected to said set input of said another set-reset flip-flop.

10. A logic circuit, comprising:

a first flip-flop having a first input for receiving a corresponding data input signal;

a first logic gate having a first input connected to receive said corresponding data input signal, a second input connected to an inverted output of said corresponding first flip-flop, and an output connected to deliver a set signal;

a second flip-flop having a first input connected to receive said set signal, a second input connected to receive a reset signal, and an output connected to deliver an output signal; and a second logic gate connected to enable a second input of said corresponding first flip-flop in responsive to said set signal.

11. The circuit of claim 10, wherein said first flip-flop comprises four logic NAND gates and a logic NOT gate.

12. The circuit of claim 10, wherein said second flip-flop comprises two logic NOR gates.

13. The circuit of claim 10, wherein said first logic gate is an XNOR logic gate.

14. The circuit of claim 10, wherein said first logic gate is an XOR gate.

15. A method of commuting a logic circuit, comprising the steps of:

supplying at least one data input signal to an input of a corresponding first flip-flop;

applying said input signal to an input of a corresponding first logic gate;

detecting a transition in said input signal using said corresponding first logic gate;

applying a set signal to an input of a second flip-flop when said input signal commutes using said first logic gate;

producing an output signal using said second flip-flop;

resetting the output of the logic circuit using a reset signal which does not depend on said first flip-flop; and enabling said first flip-flop, in responsive to said set signal, using a corresponding second logic gate.

16. The method of claim 15, wherein said first flip-flop comprises four logic NAND gates and a logic NOT gate.

17. The method of claim 15, wherein said second flip-flop comprises two logic NOR gates.

18. The method of claim 15, wherein said first logic gate is an XNOR logic gate.

19. The method of claim 15, wherein said first logic gate is an XOR gate.

20. The method of claim 15, wherein said corresponding first flip-flop has a second input connected to an output of said second logic gate, said second logic gate having a first input for receiving a power supply signal and a second input connected to receive said set signal.

21. A logic circuit, comprising:

a first flip-flop having a first input for receiving a corresponding data input signal;

an XNOR logic gate having a first input connected to receive said corresponding data input signal, a second input connected to an inverted output of said corresponding first flip-flop, and an output connected to deliver a set signal; and a second flip-flop having a first input connected to receive said set signal, a second input connected to receive a reset signal, and an output connected to deliver an output signal.

22. A logic circuit, comprising:

a first flip-flop having a first input for receiving a corresponding data input signal;

an XOR logic gate having a first input connected to receive said corresponding data input signal, a second input connected to an inverted output of said corresponding first flip-flop, and an output connected to deliver a set signal; and a second flip-flop having a first input connected to receive said set signal, a second input connected to receive a reset signal, and an output connected to deliver an output signal.

23. A logic circuit, comprising:

a first flip-flop having a first input for receiving a corresponding data input signal;

a first logic gate having a first input connected to receive said corresponding data input signal, a second input connected to an inverted output of said corresponding first flip-flop, and an output connected to deliver a set signal;

a second flip-flop having a first input connected to receive said set signal, a second input connected to receive a reset signal, and an output connected to deliver an output signal; and a second logic gate operatively connected to a second input of said first flip-flop and connected to said output of said first logic gate.

24. A logic circuit, comprising:

a first flip-flop having a first input for receiving a corresponding data input signal;

a first logic gate having a first input connected to receive said corresponding data input signal, a second input connected to an inverted output of said corresponding first flip-flop, and an output connected to deliver a set signal;

a second flip-flop having a first input connected to receive said set signal, a second input connected to receive a reset signal, and an output connected to deliver an output signal; and a second logic gate having a first input for receiving a power supply signal, a second input connected to receive said set signal of said first flip-flop, and an output connected to a second input of said first flip-flop.

25. A method of commuting a logic circuit, comprising the steps of:

supplying at least one data input signal to an input of a corresponding first flip-flop;

applying said data input signal to an input of a corresponding first logic gate, said corresponding first logic gate being an XNOR logic gate;

detecting a transition in said data input signal using said corresponding first logic gate;

applying a set signal to an input of a second flip-flop when said data input signal commutes using said first logic gate;

producing an output signal using said second flip-flop; and resetting the output of the logic circuit using a reset signal which does not depend on said first flip-flop.

26. A method of commuting a logic circuit, comprising the steps of:

supplying at least one data input signal to an input of a corresponding first flip-flop;

applying said data input signal to an input of a corresponding first logic gate, said corresponding first logic gate being an XOR logic gate;

detecting a transition in said data input signal using said corresponding first logic gate;

applying a set signal to an input of a second flip-flop when said input signal commutes using said first logic gate;

producing an output signal using said second flip-flop; and resetting the output of the logic circuit using a reset signal which does not depend on said first flip-flop.

27. A method of commuting a logic circuit, comprising the steps of:

supplying at least one data input signal to a first input of a corresponding first flip-flop;

applying said data input signal to an input of a corresponding first logic gate;

detecting a transition in said data input signal using said corresponding first logic gate;

applying a set signal to an input of a second flip-flop when said data input signal commutes using said first logic gate, said first flip-flop having a second input connected to an output of a second logic gate, said second logic gate having a first input for receiving a power supply signal and a second input connect to receive said set signal;

producing an output signal using said second flip-flop; and resetting the output of the logic circuit using a reset signal which does not depend on said first flip-flop.

* * * * *